United States Patent
Tanabe et al.

(10) Patent No.: US 9,130,555 B2
(45) Date of Patent: Sep. 8, 2015

(54) DATA HOLDING CIRCUIT AND SEMICONDUCTOR INTEGRATED CIRCUIT DEVICE

(71) Applicant: FUJITSU LIMITED, Kawasaki-shi, Kanagawa (JP)

(72) Inventors: Satoshi Tanabe, Kawasaki (JP); Kenichi Kawasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/199,611

(22) Filed: Mar. 6, 2014

(65) Prior Publication Data

US 2014/0312950 A1    Oct. 23, 2014

(30) Foreign Application Priority Data

Apr. 22, 2013   (JP) .................. 2013-089683

(51) Int. Cl.
*H03K 3/356*      (2006.01)
*H03K 3/012*      (2006.01)

(52) U.S. Cl.
CPC ............ *H03K 3/35606* (2013.01); *H03K 3/012* (2013.01)

(58) Field of Classification Search
None
See application file for complete search history.

(56) References Cited

U.S. PATENT DOCUMENTS

| | | | |
|---|---|---|---|
| 4,939,384 A * | 7/1990 | Shikata et al. ............... 327/212 |
| 5,140,179 A * | 8/1992 | Takano ........................ 327/203 |
| 5,173,870 A * | 12/1992 | Sukashita et al. ............. 708/625 |
| 5,517,132 A | 5/1996 | Ohara |
| 6,081,153 A * | 6/2000 | Hamada et al. ............... 327/333 |
| 6,417,711 B2 * | 7/2002 | Fulkerson .................... 327/203 |
| 7,132,870 B2 * | 11/2006 | Linam et al. ................. 327/202 |
| 7,218,151 B1 * | 5/2007 | Kursun et al. ................. 326/95 |
| 7,411,432 B1 * | 8/2008 | Zhu ............................. 327/117 |
| 8,081,502 B1 * | 12/2011 | Rahim et al. ................. 365/154 |
| 8,294,491 B2 * | 10/2012 | Ju et al. ........................ 326/46 |
| 8,519,743 B2 * | 8/2013 | Teh et al. ...................... 326/95 |
| 8,547,155 B2 * | 10/2013 | Holst et al. .................. 327/199 |
| 2002/0093368 A1 * | 7/2002 | Fulkerson .................... 327/203 |
| 2004/0095175 A1 * | 5/2004 | Chalasani .................... 327/202 |
| 2005/0116765 A1 | 6/2005 | Sakiyama et al. |
| 2007/0115026 A1 * | 5/2007 | Krishnan et al. ............... 326/30 |
| 2011/0018584 A1 * | 1/2011 | Teh et al. ...................... 326/95 |
| 2012/0206188 A1 * | 8/2012 | Duong ......................... 327/437 |

FOREIGN PATENT DOCUMENTS

| | | |
|---|---|---|
| JP | 7-249067 A | 9/1995 |
| JP | 11-74764 A | 3/1999 |
| JP | 2005-166698 A | 6/2005 |

* cited by examiner

*Primary Examiner* — Ryan Jager
(74) *Attorney, Agent, or Firm* — Arent Fox LLP

(57) ABSTRACT

A circuit including: an input stage that includes a first input unit into which input data is input and a pair of first output units and is driven by a first power-supply voltage; a pair of first gate elements that includes first transistors, and is driven by a clock that includes a second power-supply voltage that is lower than the first power-supply voltage; a first latch circuit that includes a pair of second input units, and is driven by the first power-supply voltage; a pair of second gate elements that includes second transistors, and is driven by an inverted clock of the clock; and a second latch circuit that includes a pair of third input units, and a third output unit that outputs one of a pair of pieces of data, and is driven by the first power-supply voltage.

8 Claims, 13 Drawing Sheets

DATA HOLDING CIRCUIT AND SEMICONDUCTOR INTEGRATED CIRCUIT DEVICE

CROSS-REFERENCE TO RELATED APPLICATION

This application is based upon and claims the benefit of priority of the prior Japanese Patent Application No. 2013-089683, filed on Apr. 22, 2013, the entire contents of which are incorporated herein by reference.

FIELD

The embodiment discussed herein is related to a data holding circuit and a semiconductor integrated circuit device.

BACKGROUND

In related art, there is a semiconductor integrated circuit in which a plurality of semiconductor circuits each of which includes a plurality of metal oxide semiconductor (MOS) transistors are provided and the semiconductor circuits are divided into regions in accordance with operation rate per unit time of each of the semiconductor circuits (for example, refer to Japanese Laid-open Patent Publication No. 2005-166698).

There is a semiconductor integrated circuit which is provided with a threshold voltage control circuit which controls a threshold voltage of MOS transistors used in a semiconductor circuit included in a corresponding region and a power-supply voltage control circuit which controls a power-supply voltage supplied to a semiconductor circuit included in a corresponding region, in each region of semiconductor circuits which are divided into regions.

Here, a semiconductor integrated circuit of related art includes semiconductor circuits which are divided into regions, but it is difficult to reduce overhead because circuits such as a level shifter have to be provided to the semiconductor integrated circuit.

SUMMARY

According to an aspect of the embodiments, a circuit includes a circuit includes: an input stage that includes a first input unit into which input data is input and a pair of first output units and is driven by a first power-supply voltage; a pair of first gate elements that includes first transistors, and is driven by a clock that includes a second power-supply voltage that is lower than the first power-supply voltage; a first latch circuit that includes a pair of second input units, and is driven by the first power-supply voltage; a pair of second gate elements that includes second transistors, and is driven by an inverted clock of the clock; and a second latch circuit that includes a pair of third input units, and a third output unit that outputs one of a pair of pieces of data, and is driven by the first power-supply voltage.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

A technical premise is described below before a data holding circuit and a semiconductor integrated circuit device according to an embodiment of the present disclosure are described.

A power delay (PD) product in a semiconductor integrated circuit device which includes a clock transmission circuit which transmits a clock, a combination circuit which operates on the basis of a clock which is output from the clock transmission circuit, and the like is expressed by formula (1) below. A power delay (PD) product represents consumption energy.

$$PD = C_{\it eff} V_{DD}^2 \alpha + I_{leak} V_{DD} \frac{1}{F_{max}} \quad (1)$$

Here, $C_{\it eff}$ denotes capacity of N (N is an integer equal to or larger than 2) pieces of gate circuits which are connected in series between a flip flop (FF) through which data is input into the semiconductor integrated circuit device and a FF which outputs data.

VDD denotes a power-supply voltage and α denotes an operation rate. $I_{leak}$ denotes leak current of the gate circuits which are included in the semiconductor integrated circuit device, and the operation rate α denotes a rate of an operation per clock cycle of a circuit which is included in the semiconductor integrated circuit device. $F_{max}$ denotes the maximum frequency (maximum operable frequency) at which the gate circuits which are included in the semiconductor integrated circuit device are operable when a power-supply voltage and a substrate voltage are fixed.

A relation among a power-supply voltage VDD, a substrate voltage VB, and an operation rate α at which a PD product is minimum is now described with reference to FIGS. 1A and 1B.

Figure 1A:
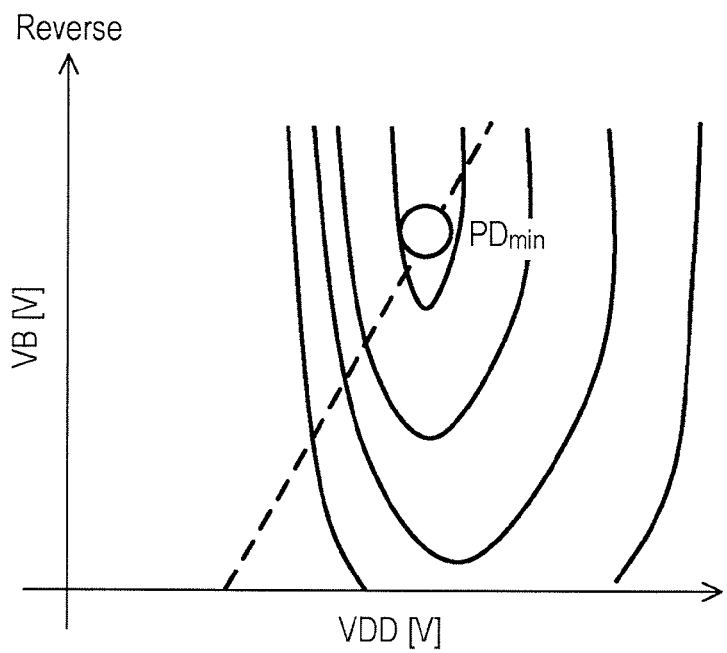
FIGS. 1A and 1B illustrate isopleths of a power delay product with respect to a power-supply voltage VDD and a substrate voltage VB.
Figure 1B:
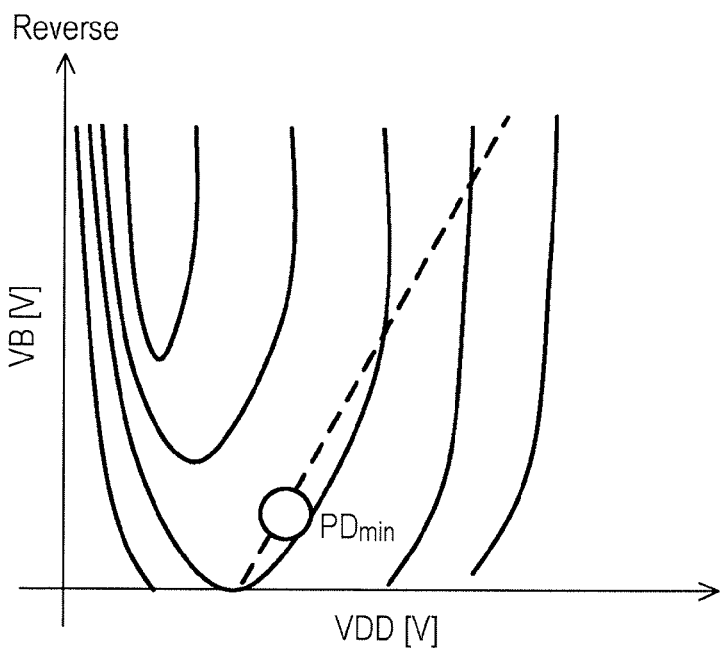

FIGS. 1A and 1B illustrate isopleths of a PD product with respect to a power-supply voltage VDD and a substrate voltage VB. In FIGS. 1A and 1B, a horizontal axis represents a power-supply voltage VDD and a vertical axis represents a substrate voltage VB. The substrate voltage VB becomes a reverse bias as the substrate voltage VB rises, and the substrate voltage VB becomes a forward bias as the substrate voltage VB falls (as the substrate voltage VB becomes closer to the horizontal axis).

FIG. 1A illustrates isopleths of a PD product in a case in which an operation rate α is relatively low, and FIG. 1B illustrates isopleths of a PD product in a case in which an operation rate α is relatively high. Isopleths of a PD product represents that a PD product is decreased toward the center of the isopleths, and a central point represents the minimum value $PD_{min}$ of a PD product. The minimum value $PD_{min}$ of a PD product represents an optimum operation point.

Further, a straight line on which the maximum operable frequency $F_{max}$ is approximately invariable is represented by a dashed line in FIGS. 1A and 1B.

As illustrated in FIG. 1A, in a case in which the operation rate α is relatively low, an optimum operation point at which the minimum value $PD_{min}$ of a PD product is provided is obtained when a power-supply voltage VDD is high and a substrate voltage VB is a reverse bias.

Further, as illustrated in FIG. 1B, in a case in which the operation rate α is relatively high, an optimum operation point at which the minimum value $PD_{min}$ of a PD product is provided is obtained when a power-supply voltage VDD is low and a substrate voltage VB is a forward bias.

Figure 2:
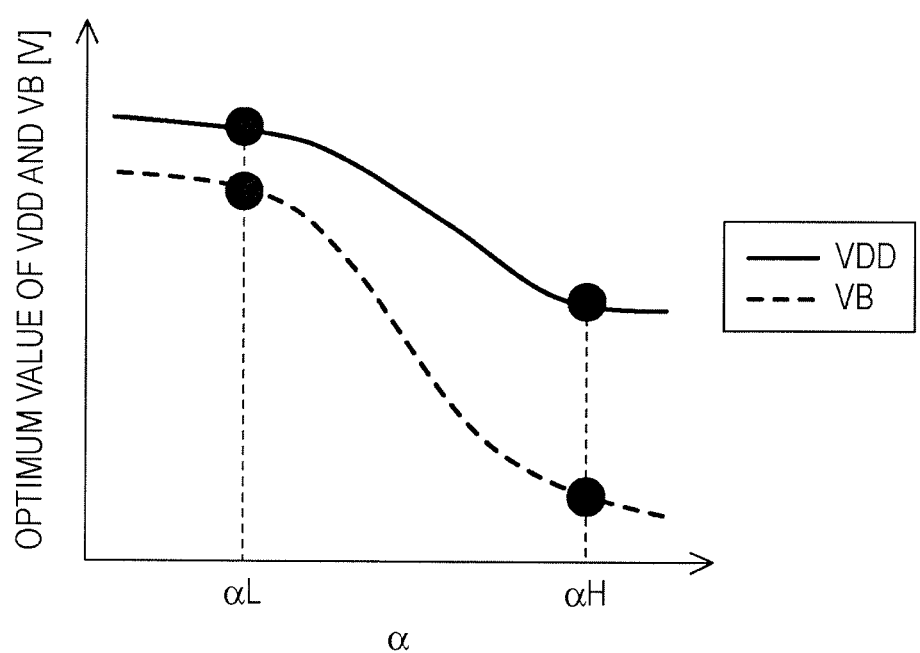
FIG. 2 is a characteristic diagram illustrating a relation of optimum values of a power-supply voltage VDD and a substrate voltage VB with respect to an operation rate α.

FIG. 2 is a characteristic diagram illustrating a relation of optimum values of a power-supply voltage VDD and a substrate voltage VB with respect to an operation rate α. In FIG. 2, a horizontal axis represents an operation rate α and a vertical axis represents optimum values of a power-supply voltage VDD and a substrate voltage VB. The substrate voltage VB becomes a reverse bias as the substrate voltage VB rises, and the substrate voltage VB becomes a forward bias as the substrate voltage VB falls (as the substrate voltage VB becomes closer to the horizontal axis).

As illustrated in FIG. 2, it is understood that it is optimum that the power-supply voltage VDD is high and the substrate voltage VB is a reverse bias in the case of the relatively low operation rate αL. Further, it is understood that it is optimum that the power-supply voltage VDD is low and the substrate voltage VB is a forward bias in the case of the relatively high operation rate αH.

Here, by using a voltage $V_{nw}$ of an N well and a voltage $V_{pw}$ of a P well which are included in the semiconductor integrated circuit device, the substrate voltage VB is expressed as $VB=-V_{pw}$ or $VB=VDD-V_{nw}$. Here, $VDD-V_{nw}=-V_{pw}$ is described in this example, but both sides do not have to be equal to each other.

Thus, optimum operation points are different between the case of a large operation rate α and the case of a small operation rate α, so that a power supply of circuits which are included in the semiconductor integrated circuit device may be controlled divisionally.

Figure 3A:
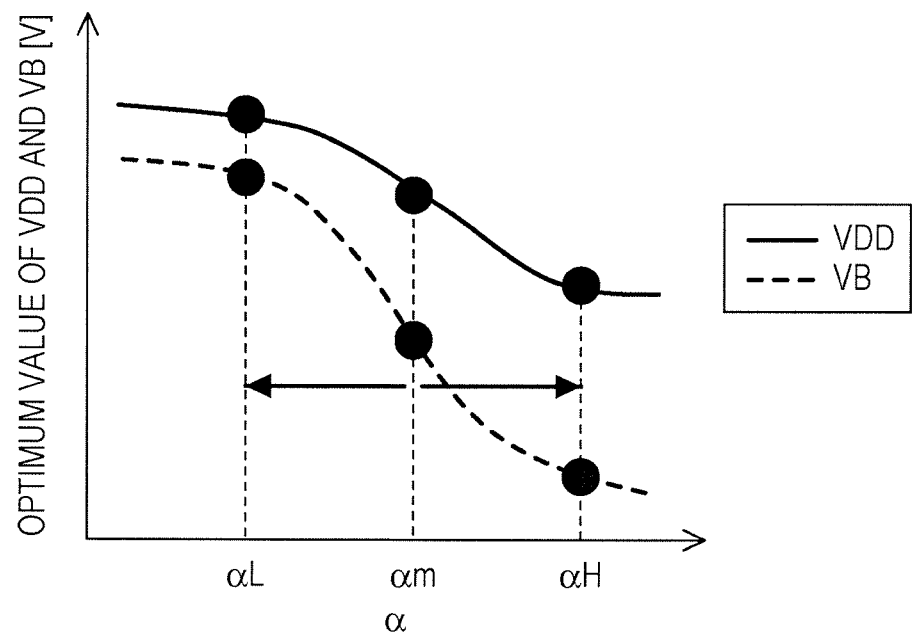
FIG. 3A is a characteristic diagram illustrating a relation of optimum values of a power-supply voltage VDD and a substrate voltage VB with respect to an operation rate α.
Figure 3B:
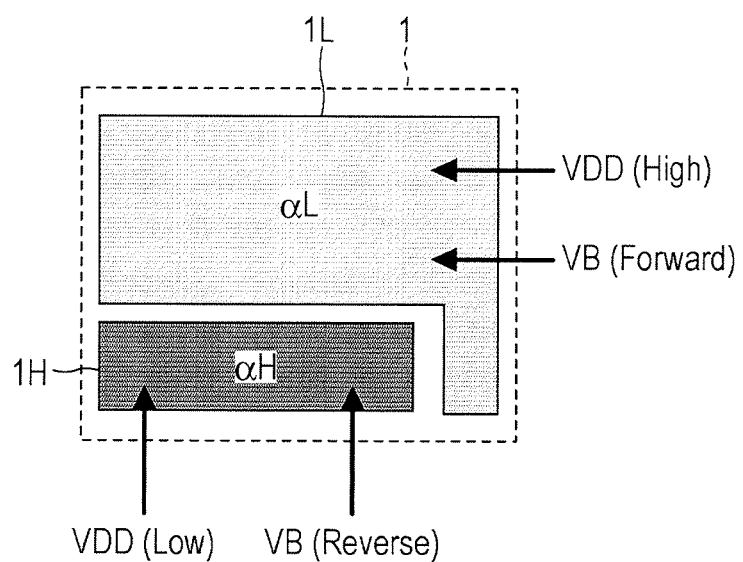
FIG. 3B illustrates a concept of division control.

FIG. 3A is a characteristic diagram illustrating a relation of optimum values of a power-supply voltage VDD and a substrate voltage VB with respect to an operation rate α, and FIG. 3B illustrates a concept of division control.

It is assumed that in a case in which a first circuit having a relatively low operation rate αL and a second circuit having a relatively high operation rate αH are included in a semiconductor integrated circuit device, a power-supply voltage VDD and a substrate voltage VB at which the operation rates of the first circuit and the second circuit become an average value αm of the αL and the αH are selected as illustrated in FIG. 3A.

Thus, in a case in which the average operation rate αm is selected to collectively control the power-supply voltage VDD and the substrate voltage VB, operation efficiency of the whole of the semiconductor integrated circuit device including the first circuit and the second circuit is not improved.

Therefore, a semiconductor integrated circuit device 1 is divided into a first circuit 1L and a second circuit 1H, and a high power-supply voltage VDD (High) and a substrate voltage VB of a forward bias (Forward) are supplied to the first circuit 1L. Further, a low power-supply voltage VDD (Low) and a substrate voltage VB of a reverse bias (Reverse) are supplied to the second circuit 1H.

Thus, different power-supply voltages VDD and substrate voltages VB are supplied to the first circuit 1L exhibiting the low operation rate α and the second circuit 1H exhibiting the high operation rate α, making it possible to reduce a PD product (consumption energy) at the maximum operable frequency $F_{max}$.

Subsequently, a difference between a PD product in a case in which the power-supply voltage VDD and the substrate voltage VB are collectively controlled (batch control) and a PD product in a case in which the power-supply voltage VDD and the substrate voltage VB are controlled in a divided manner in accordance with the operation rate α (division control) is described with reference to FIG. 4.

Figure 4:
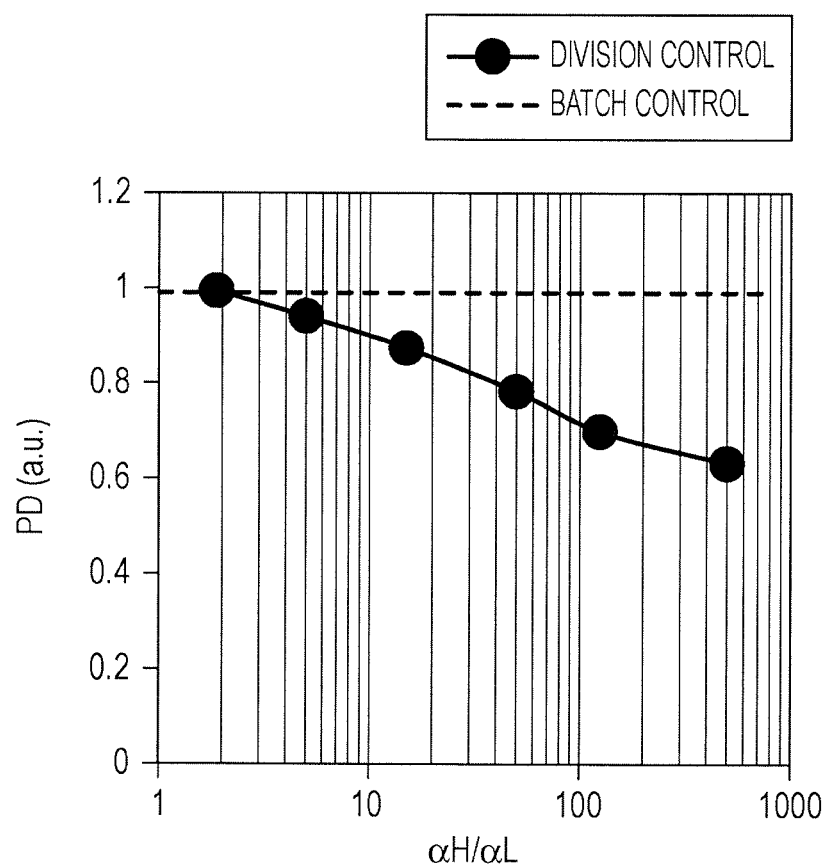
FIG. 4 illustrates a PD product (absolute value) of batch control and a PD product (absolute value) with respect to a ratio (αH/αL) of operation rates in division control.

FIG. 4 illustrates a PD product (absolute value) of batch control and a PD product (absolute value) with respect to a ratio of operation rates (αH/αL) in division control. Here, a PD product (absolute value) of batch control is represented by a dashed line in FIG. 4 for the sake of convenience of comparison, though no ratio (αH/αL) is generated in the case of the batch control.

As is apparent from FIG. 4, as the ratio of operation rates (αH/αL) is increased, the PD product is decreased when the division control is executed. This represents that as a difference between the high operation rate αH and the low operation rate αL is increased, reduction efficiency of a PD product is enhanced.

Accordingly, it is very beneficial to divide power-supply voltages VDD and substrate voltages VB of a circuit exhibiting a high operation rate α and a circuit exhibiting a low operation rate α (division control) for reduction of a PD product.

Here, it is important to reduce so-called overhead in the semiconductor integrated circuit device. The same goes when the division control is executed.

However, division control with small overhead has not been realized yet.

Figure 5:
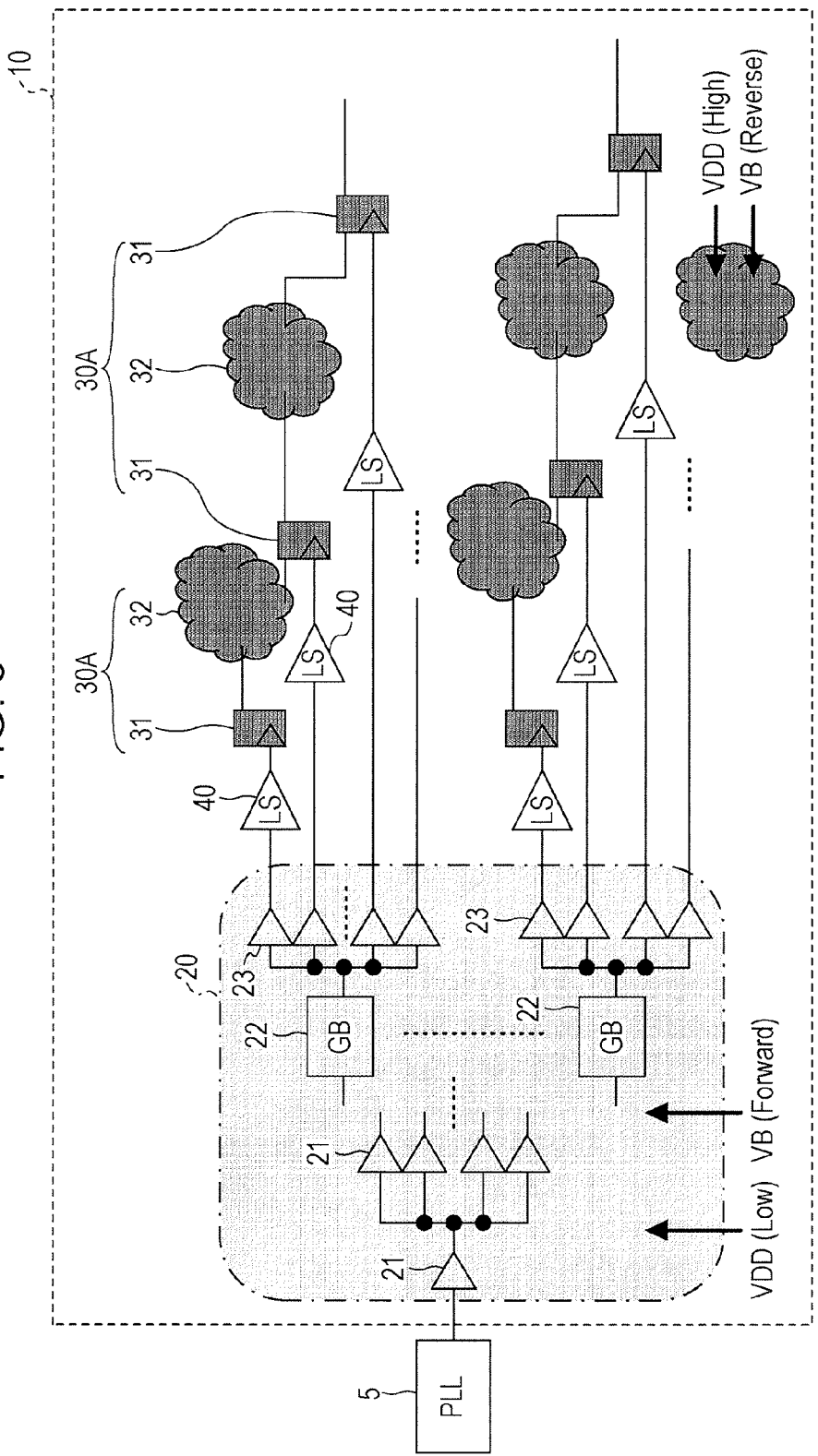
FIG. 5 illustrates a semiconductor integrated circuit device in which division control in a technical premise is performed.

FIG. 5 illustrates a semiconductor integrated circuit device 10 in which division control of the technical premise is performed.

As illustrated in FIG. 5, the semiconductor integrated circuit device 10 in which the division control according to the technical premise is performed is divided into a circuit 20, circuits 30, and level shifters 40.

The circuit 20 is a clock system circuit into which a clock signal is input from a phase locked loop (PLL) 5 and includes buffers 21, gated buffers (GBs) 22, buffers 23, and the like which transmit a clock output from the PLL 5. The buffer 21 is an input stage and the buffer 23 is an output stage. Here, the circuit 20 is indicated in light gray in FIG. 5.

The circuit 30 is a circuit which includes a transmission gate flip flop (TGFF) 31, a combination circuit, and the like. A clock output from the circuit 20 is input into the TGFF 31 of the circuit 30 via the level shifter 40. Further, the TGFF 31 is connected also to an output side of a combination circuit 32. The circuit 30 is indicated in dark gray in FIG. 5.

Here, the circuit 20 is a circuit exhibiting a high operation rate α, so that a low power-supply voltage VDD (Low) and a substrate voltage VB of a forward bias (Forward) are supplied to the circuit 20. The operation rate α of the circuit 20 is high because the circuit 20 is a clock system circuit. For example, the operation rate α of the circuit 20 is from 1.5 to 2.0.

Further, the circuit 30 is a circuit of which an operation rate α is lower than that of the circuit 20, so that a high power-supply voltage VDD (High) and a substrate voltage VB of a reverse bias (Reverse) are supplied to the circuit 30. The operation rate α of the circuit 30 is low because the circuit 30 deals with data and the number of operations of the circuit 30 is smaller than that of a clock system circuit. For example, the operation rate α of the circuit 30 is equal to or smaller than 0.02.

The level shifter 40 is connected between the buffer 23 of the circuit 20 and the TGFF 31. A high power-supply voltage VDD (High), a low power-supply voltage VDD (Low), and a ground voltage (VSS) are supplied to the level shifter 40.

Here, in the semiconductor integrated circuit device 10 illustrated in FIG. 5, a voltage of a clock output from the buffer 23 which is the output stage of the circuit 20 is raised by the level shifter 40, and then the clock is input into the TGFF 31.

The level shifter 40 is connected with the buffer 23, so that an operation rate α is increased, increasing power consumption.

Further, the semiconductor integrated circuit device 10 illustrated in FIG. 5 includes the level shifter 40, causing increase of an area and degradation of performance (especially, skew) and therefore, increasing overhead.

Thus, the semiconductor integrated circuit device 10 illustrated in FIG. 5 has problems such as increase of power consumption, increase of an area, and degradation of performance (especially, skew).

A semiconductor integrated circuit device 50 according to another technical premise is now described with reference to FIG. 6.

Figure 6:
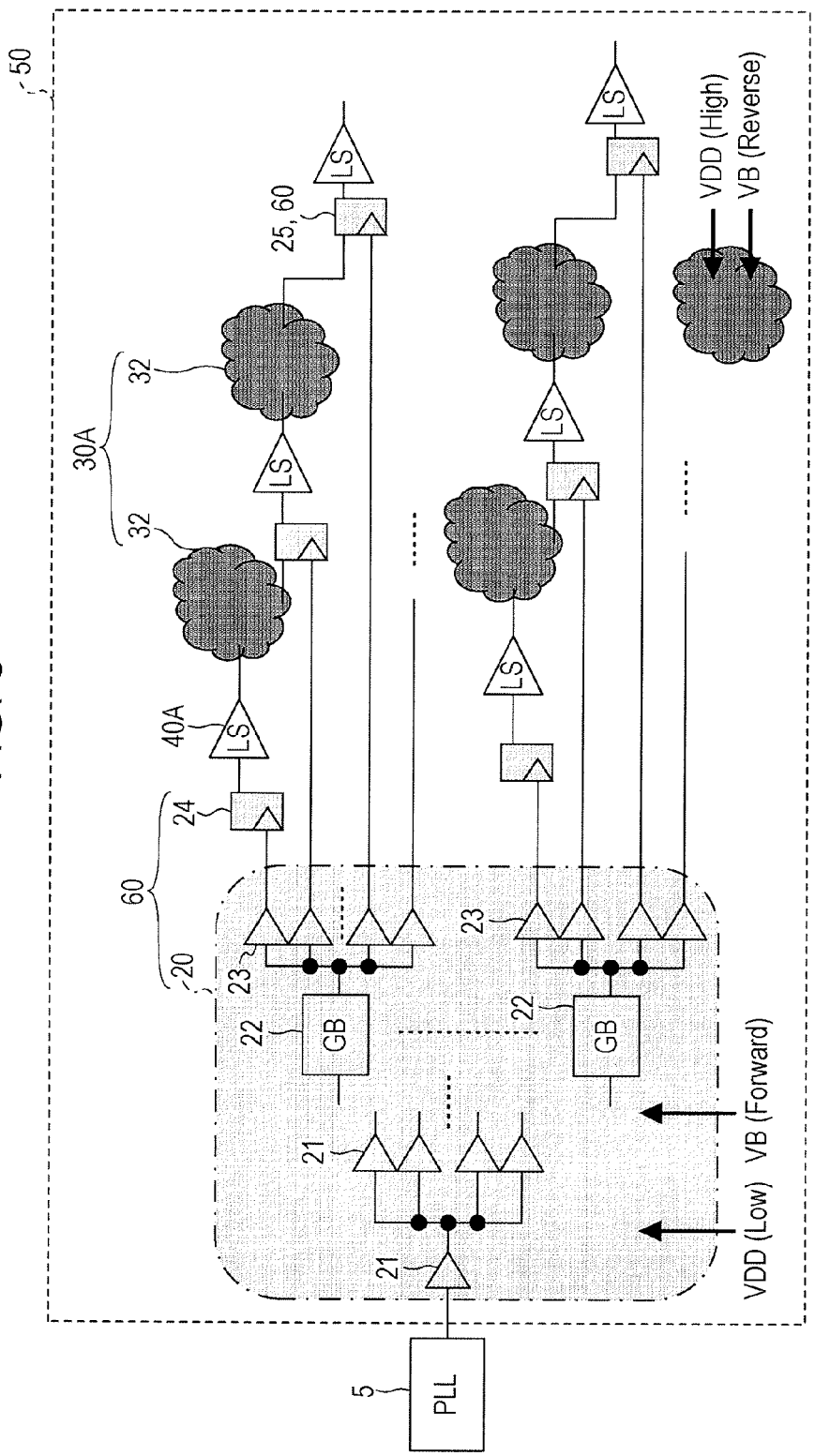
FIG. 6 illustrates a semiconductor integrated circuit device according to another technical premise.

FIG. 6 illustrates the semiconductor integrated circuit device 50 according to another technical premise.

The semiconductor integrated circuit device 50 includes a circuit 60, circuits 30A, and level shifters 40A.

The circuit 60 includes a circuit 20 and transmission gate flip flops 24 and 25. The circuit 20 is the same as the circuit 20 illustrated in FIG. 5.

The TGFF 24 is provided between a buffer 23 which is an output stage of the circuit 20 and the level shifter 40A and data is input into the TGFF 24 from a circuit which is not illustrated. The TGFF 25 is provided between a combination circuit 32 and the level shifter 40A. Into the TGFF 25, data is input from the combination circuit 32 and a clock is input from the circuit 20.

To the circuit 20 and the TGFFs 24 and 25, a low power-supply voltage VDD (Low) and a substrate voltage VB of a forward bias (Forward) are supplied.

Here, a low power-supply voltage VDD (Low) and a substrate voltage VB of a forward bias (Forward) are supplied to the TGFFs 24 and 25, but an operation rate α of the TGFFs 24 and 25 is low as is the case with the TGFF 31 illustrated in FIG. 5.

The circuit 30A includes the combination circuit 32. The combination circuit 32 is the same as the combination circuit 32 illustrated in FIG. 5. To the combination circuit 32, a high power-supply voltage VDD (High) and a substrate voltage VB of a reverse bias (Reverse) are supplied.

The level shifter 40A is provided between the TGFF 24 and the combination circuit 32. To the level shifter 40A, a high power-supply voltage VDD (High), a low power-supply voltage VDD (Low), and a ground voltage (VSS) are supplied.

The semiconductor integrated circuit device 50 is obtained such that the level shifter 40 of the semiconductor integrated circuit device 10 illustrated in FIG. 5 is moved to the output side of the TGFF 31 and the TGFF 31 is driven by a power-supply voltage VDD and a substrate voltage VB which are the same as those of the circuit 20.

Accordingly, in the semiconductor integrated circuit device 50 according to another technical premise illustrated in FIG. 6, it is possible to reduce the number of operations of the level shifter 40A compared to the semiconductor integrated circuit device 10 according to the technical premise illustrated in FIG. 5, thereby making it possible to reduce power consumption. Further, degradation of performance (especially, skew) is remedied in some measure compared to the semiconductor integrated circuit device 10 according to the technical premise illustrated in FIG. 5.

However, increase of an area is the same as that of the semiconductor integrated circuit device 10 illustrated in FIG. 5. Further, it is possible to reduce power consumption of the level shifter 40A, but power consumption of the level shifter 40A is not removed as long as the level shifter 40A is included. Thus, reduction of overhead is insufficient.

Further, in a case in which the TGFFs 24 and 25 are driven by a low power-supply voltage VDD (Low) and a substrate voltage VB of a forward bias (Forward) as illustrated in FIG. 6, the following problem arises. Description is given by taking a TGFF 70 illustrated in FIG. 7 as an example here.

Figure 7:
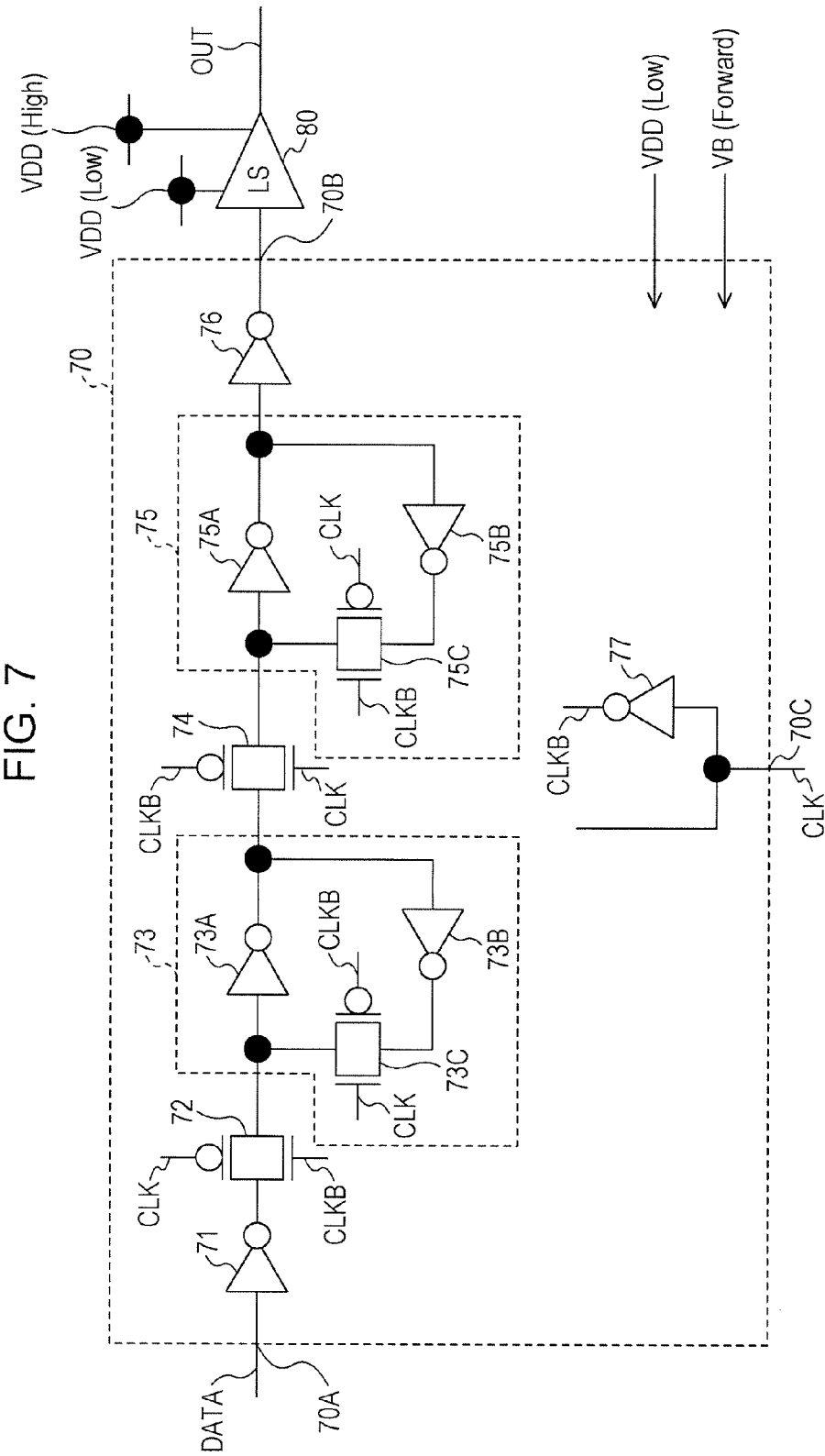
FIG. 7 illustrates the circuit configuration of a TGFF according to the technical premise.

FIG. 7 illustrates the circuit configuration of the TGFF 70 according to the technical premise.

The TGFF 70 includes an input terminal 70A, an inverter 71, a transfer gate (TG) 72, a master latch 73, a TG 74, a slave latch 75, an inverter 76, an inverter 77, an output terminal 70B, and a clock input terminal 70C. The TGFF 70 corresponds to the TGFFs 24 and 25 illustrated in FIG. 6. In the TGFF 70, data is input into the input terminal 70A and a clock is input into the clock input terminal 70C.

The input terminal 70A is an input terminal of the TGFF 70 and data is input into the input terminal 70A.

An input terminal of the inverter 71 is connected with the input terminal 70 and an output terminal is connected with the TG 72.

The TG 72 is a gate element in which main paths (path between a drain and a source) of a P-channel metal oxide semiconductor (PMOS) transistor and an N-channel metal oxide semiconductor (NMOS) transistor are mutually connected in parallel. An input terminal of the TG 72 is connected with the output terminal of the inverter 71 and an output terminal of the TG 72 is connected with an input terminal of the master latch 73.

A clock CLK is input into a gate of the PMOS transistor of the TG 72 and a clock CLKB is input into a gate of the NMOS transistor. The clock CLKB is a clock obtained by inverting the clock CLK.

The master latch 73 includes inverters 73A and 73B and a TG 73C. The input terminal of the master latch 73 is connected with the output terminal of the TG 72 and an output terminal is connected with an input terminal of the TG 74.

The TG 73C is a gate element in which main paths (path between a drain and a source) of a PMOS transistor and an NMOS transistor are mutually connected in parallel. A clock CLKB is input into a gate of the PMOS transistor of the TG 72 and a clock CLK is input into a gate of the NMOS transistor. Thus, the TG 73C operates in a state in which phases of the clocks CLK and CLKB are shifted by a half cycle from those of the TG 72.

The inverter 73A is inserted between the input terminal and the output terminal of the master latch 73 in series. The inverter 73B and the TG 73C are connected between an input terminal and an output terminal of the inverter 73A in parallel. That is, the inverters 73A and 73B and the TG 73C are connected in a loop shape between the input terminal and the output terminal of the master latch 73, as illustrated in FIG. 7. The master latch 73 inverts input data and outputs the inverted data.

The input terminal of the TG 74 is connected with the output terminal of the master latch 73 and an output terminal is connected with an input terminal of the slave latch 75. The TG 74 includes a PMOS transistor and an NMOS transistor of which main paths are mutually connected in parallel, as is the case with the TGs 72 and 73C.

A clock CLKB is input into a control terminal of the PMOS transistor of the TG 74 and a clock CLK is input into a control terminal of the NMOS transistor. The TG 74 operates in the same phase as the TG 73C.

The slave latch 75 includes inverters 75A and 75B and a TG 75C in a similar fashion to the master latch 73. The input terminal of the slave latch 75 is connected with an output terminal of the TG 74 and an output terminal is connected with an input terminal of the inverter 76.

A connection relation of the inverters 75A and 75B and the TG 75C is the same as that of the inverters 73A and 73B and the TG 73C of the master latch 73, but a clock CLK is input into a control terminal of a PMOS transistor of the TG 75C and a clock CLKB is input into a control terminal of an NMOS transistor. That is, the TG 75C operates in the same phase as the TG 72.

The input terminal of the inverter 76 is connected with the output terminal of the slave latch 75 and an output terminal is connected with an input terminal of a level shifter 80 via the output terminal 70B of the TGFF 70.

The inverter 77 is inserted into one of branch paths which are connected to the clock input terminal 70C of the TGFF 70 and is provided to generate a differential clock. The inverter 77 inverts a clock CLK and outputs a clock CLKB.

A clock CLK input from the clock input terminal 70C and a clock CLKB output from the inverter 77 constitute a differential clock and are supplied to the TGs 72, 73C, 74, and 75C.

In the TGFF 70, when data is input into the input terminal 70A and a clock CLK is input into the clock input terminal 70C, the TGs 72 and 75C output data of input terminals in the same phase and the TGs 73C and 74 operate in phases shifted by a half cycle of clocks CLK and CLKB from the TGs 72 and 75C and output data of the input terminals.

Therefore, data input into the input terminal 70A is inverted in the inverter 71, travels through the TG 72, is inverted in the master latch 73, travels through the TG 74, is inverted in the slave latch 75, is inverted in the inverter 76, and is input into the level shifter 80. That is, data input into the input terminal 70A is inverted four times and thus, the data is input into the level shifter 80 in a state of an original signal level.

The TGFF 70 is driven by a low power-supply voltage VDD (Low) and a substrate voltage VB of a forward bias (Forward).

Further, a low power-supply voltage VDD (Low) and a high power-supply voltage VDD (High) are supplied to the level shifter 80. The level shifter 80 raises a signal level of output data of the TGFF 70 from a voltage level of the power-supply voltage VDD (Low) to a voltage level of the power-supply voltage VDD (High) and outputs the data.

Here, a substrate voltage VB of a forward bias (Forward) is supplied to the TGFF 70, so that leak current is generated in the inverters 71, 73A, 73B, 75A, 75B, and 76. Leak current flows also when the inverters 71, 73A, 73B, 75A, 75B, and 76 do not operate, causing a problem of increase in power consumption in the TGFF 70 to which a substrate voltage VB of a forward bias (Forward) is supplied.

Further, a signal level of output data of the TGFF 70 is a signal level of a low power-supply voltage VDD (Low), so that a signal level of data has to be raised in the level shifter 80 before the data is supplied to the combination circuit 32 (refer to FIG. 6) to which a high power-supply voltage VDD (High) is supplied.

That is, in the TGFF 70 to which a substrate voltage VB of a forward bias (Forward) is supplied, the level shifter 80 has to be provided on the output side, causing a problem of increase in overhead due to an area for arranging the level shifter 80 in the semiconductor integrated circuit device and power consumption of the level shifter 80.

Figure 8:
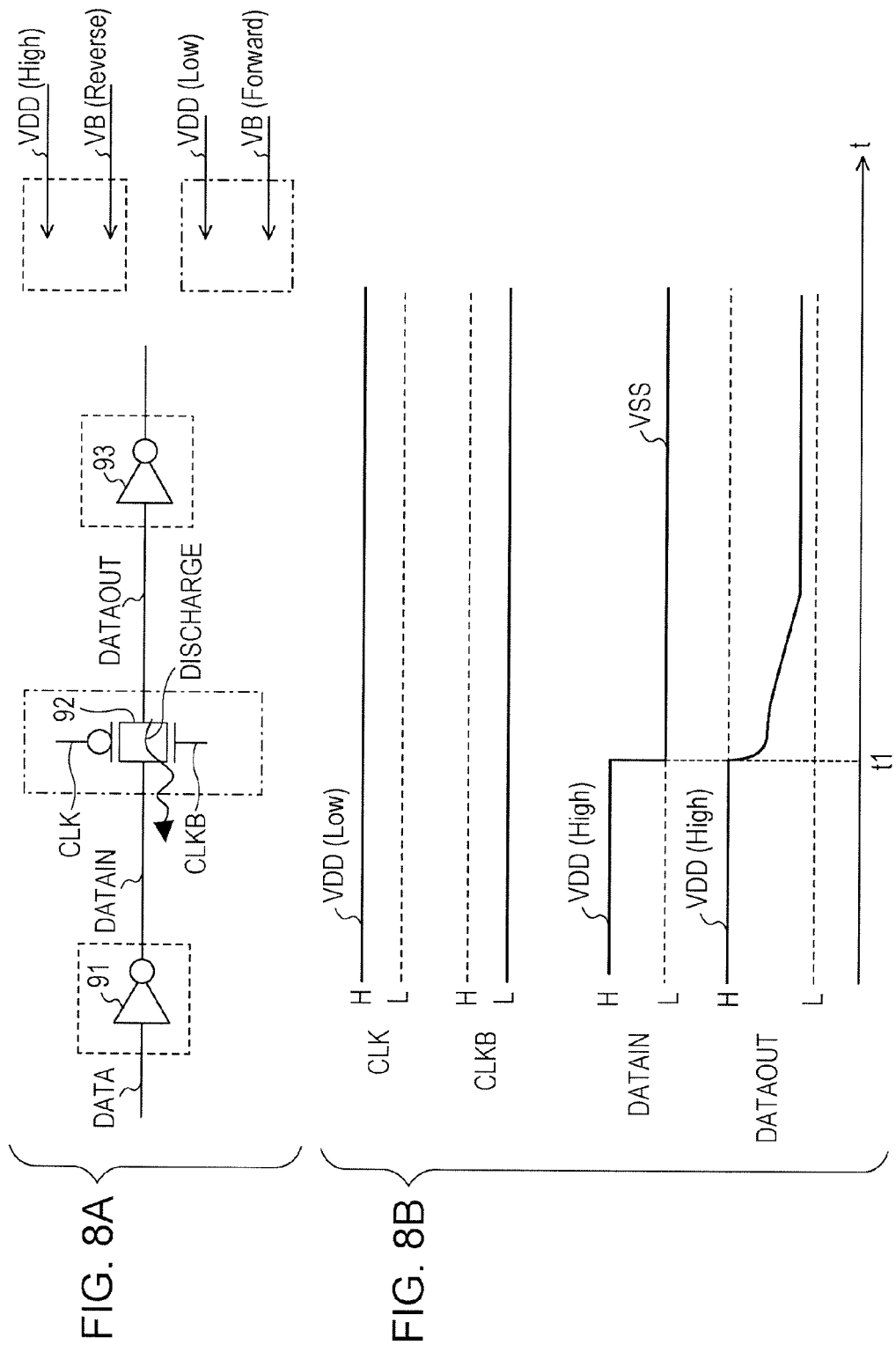
FIG. 8A illustrates a circuit which divisionally controls inverters and a TG.
FIG. 8B is a timing chart.

Here, in order to reduce overhead caused by the level shifter 80, the inverters 71, 73A, 73B, 75A, 75B, and 76 and the TGs 72, 73C, 74, and 75C which are included in the TGFF 70 may be divisionally controlled, thereby implementing a circuit which includes no level shifter 80. In this example, division control of inverters and TGs is considered with reference to FIGS. 8A and 8B.

FIG. 8A illustrates a circuit which divisionally controls inverters 91 and 93 and a TG 92, and FIG. 8B is a timing chart.

The circuit illustrated in FIG. 8A includes the inverter 91, the TG 92, and the inverter 93, and the inverter 91, the TG 92, and the inverter 93 are connected in this order in a direction in which data flows.

In division control of the circuit illustrated in FIG. 8A, the inverters 91 and 93 are driven by a high power-supply voltage VDD (High) and a substrate voltage VB of a reverse bias (Reverse) and the TG 92 is driven by a low power-supply voltage VDD (Low) and a substrate voltage VB of a forward bias (Forward). Supply of the high power-supply voltage VDD (High) to the inverters 91 and 93 realizes omission of the level shifter 80 which is illustrated in FIG. 7.

Here, a clock CLK is input into a control terminal of a PMOS transistor of the TG 92 and a clock CLKB is input into a control terminal of an NMOS transistor. The low power-supply voltage VDD (Low) is supplied to the TG 92, so that signal levels of H levels of the clocks CLK and CLKB are a VDD (Low).

As illustrated in FIG. 8B, it is assumed that in a case in which the clock CLK is on the H level (VDD (Low)) and the clock CLKB is on the L level (VSS) before time t1, input data DATAIN of the TG 92 is shifted from the H level to the L level at time t1. Here, VSS is a ground voltage.

At this time, both of the PMOS transistor and the NMOS transistor of the TG 92 are off, output data DATAOUT of the TG 92 is fundamentally to maintain the H level without shifting after time t1 as well, as represented by a dashed line in FIG. 8B.

However, a signal level of the H level of a gate signal which is input into the control terminal (gate) of the PMOS transistor of the TG 92 is a voltage level of the low power-supply voltage VDD (Low), so that the PMOS transistor may not be completely turned off.

In this case, the output data DATAOUT of FIG. 8B is gradually lowered after time a, as represented by a solid line.

Thus, in a case in which the inverters 91 and 93 are driven by a high power-supply voltage VDD (High) and a substrate voltage VB of a reverse bias (Reverse) and the TG 92 is driven by a low power-supply voltage VDD (Low) and a substrate voltage VB of a forward bias (Forward) so as to omit the level shifter 80 of FIG. 7, the TG 92 may have difficulty in retaining data.

When the TG 92 has difficulty in retaining data, a malfunction or the like occurs in the semiconductor integrated circuit device, lowering reliability.

Therefore, in an embodiment described below, a data holding circuit and a semiconductor integrated circuit device which reduce overhead and are highly reliable are provided.

Figure 9:
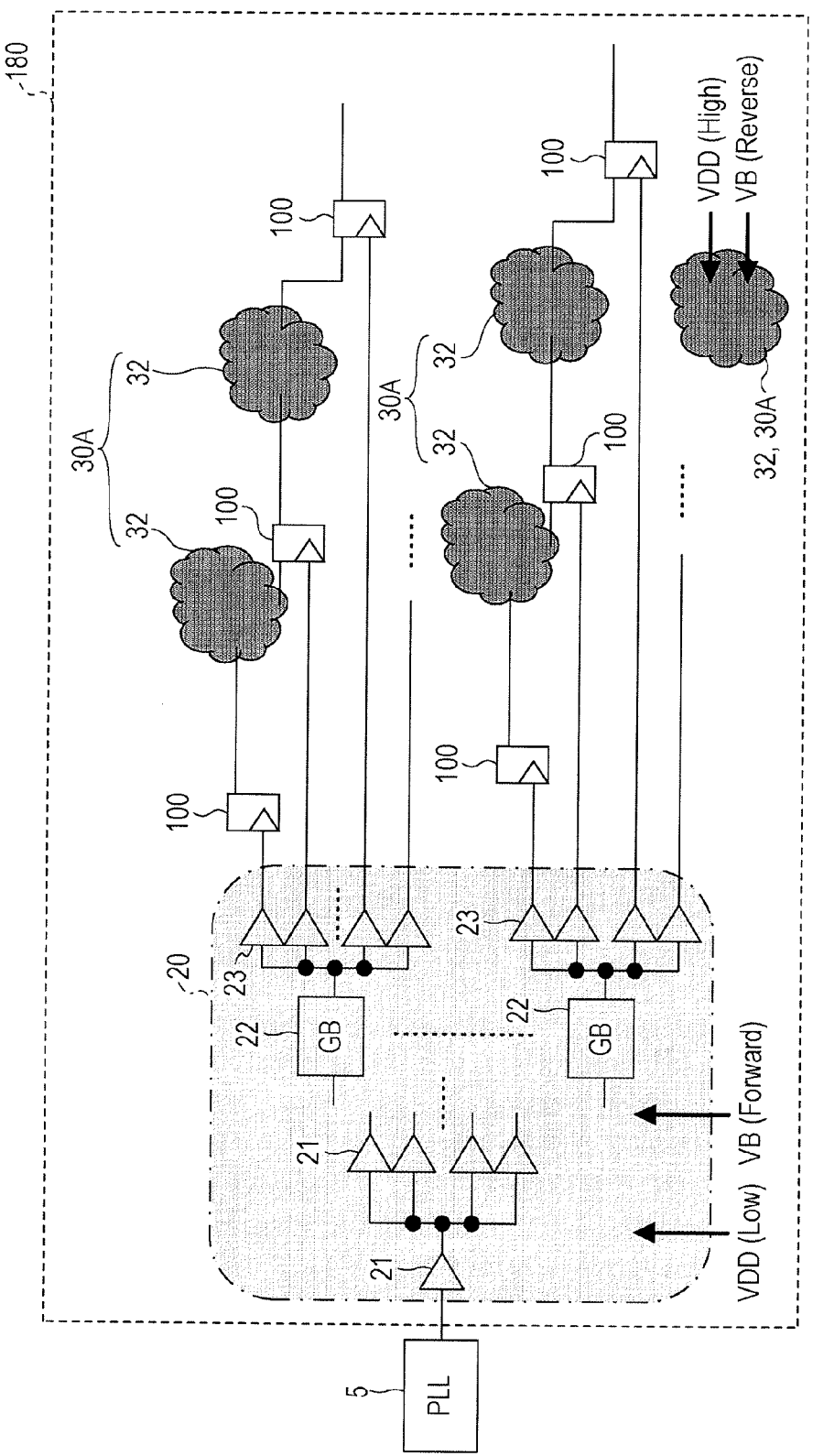
FIG. 9 illustrates a semiconductor integrated circuit device including a data holding circuit.

FIG. 9 illustrates a semiconductor integrated circuit device 180 including a data holding circuit 100.

The semiconductor integrated circuit device 180 is divided into a circuit 20, circuits 30A, and data holding circuits 100.

In the following description of the semiconductor integrated circuit device 180 including the data holding circuit 100, constituent elements that are the same as those of the semiconductor integrated circuit device 10 (refer to FIG. 5) and the semiconductor integrated circuit device 50 (refer to FIG. 6) of the technical premise are given the same reference characters and description thereof is omitted.

In FIG. 9, an operation rate α of the circuit 20 is high, so that a low power-supply voltage VDD (Low) and a substrate voltage VB of a forward bias (Forward) are supplied to the circuit 20. The circuit 20 is indicated in light gray.

The circuit 30A includes combination circuits 32 of which an operation rate α is lower than that of the circuit 20, so that a high power-supply voltage VDD (High) and a substrate voltage VB of a reverse bias (Reverse) are supplied to the circuit 30A. The circuit 30A is indicated in dark gray. A high power-supply voltage VDD (High) is an example of a first power-supply voltage and a low power-supply voltage VDD (Low) is an example of a second power-supply voltage.

For example, the operation rate α of the circuit 20 is from 1.5 to 2.0 and the operation rate α of the circuit 30A is equal to or lower than 0.02.

The semiconductor integrated circuit device 180 including the data holding circuit 100 includes no level shifter.

The data holding circuit 100 receives data from the combination circuit 32 and operates in accordance with a clock CLK received from the circuit 20, so as to output data which has been held in the inside. Here, FIG. 9 also illustrates data holding circuits 100 from which combination circuits 32 on input sides are omitted, but data is input into all of the data holding circuits 100 from the combination circuits 32.

Details of the data holding circuit 100 are described below with reference to FIG. 10.

Figure 10:
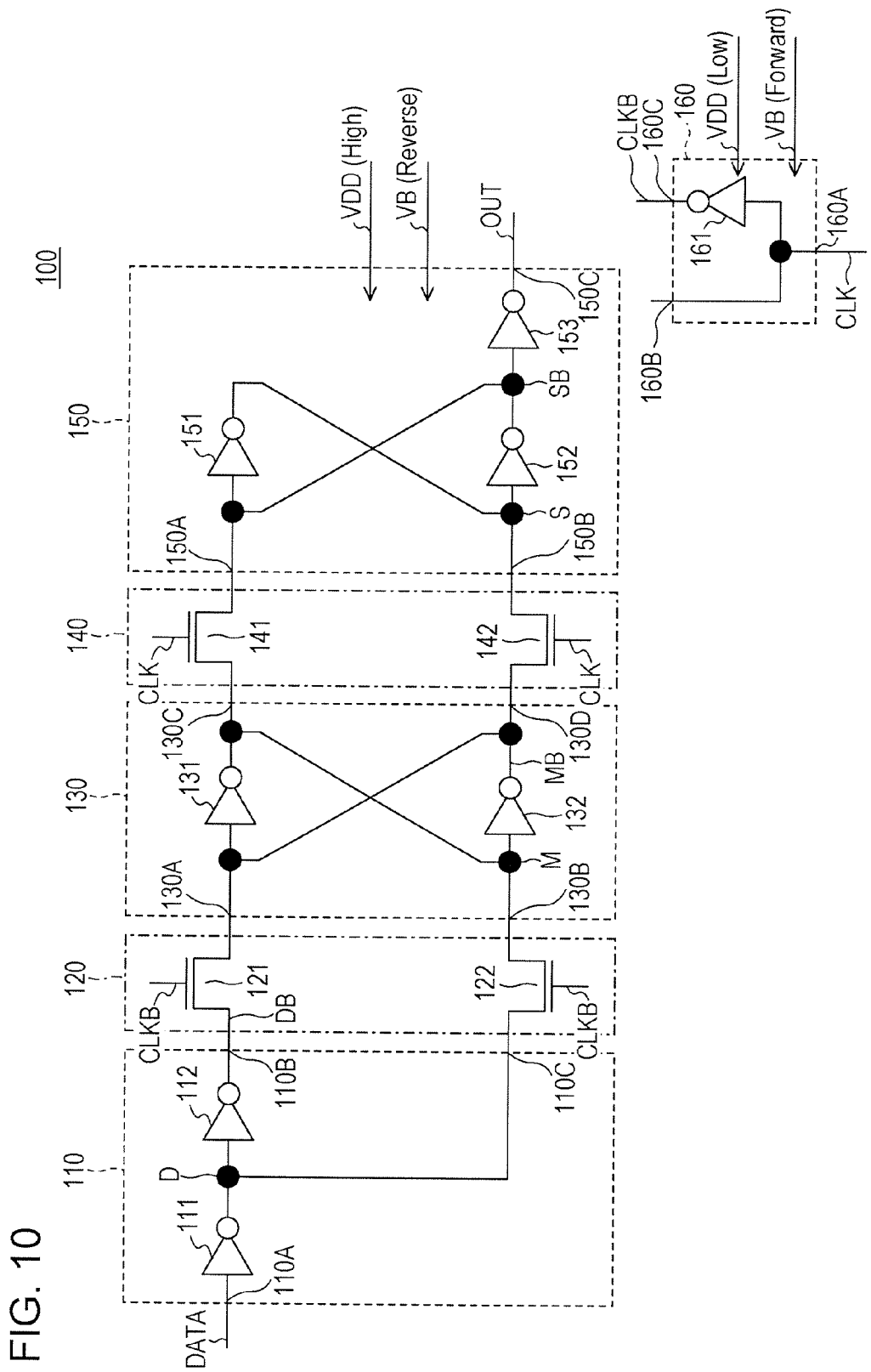
FIG. 10 illustrates the data holding circuit.

FIG. 10 illustrates the data holding circuit 100.

The data holding circuit 100 includes an input stage 110, a gate unit 120, a master latch 130, a gate unit 140, and a slave latch 150.

Further, FIG. 10 illustrates a clock generation unit 160 in addition to the data holding circuit 100. In this description, the clock generation unit 160 is not a constituent element of the data holding circuit 100 but is included in the circuit 20 (refer to FIG. 9). However, the clock generation unit 160 may be included in the data holding circuit 100. In this case, the clock generation unit 160 is included in each of a plurality of data holding circuits 100 in FIG. 9.

The input stage 110 includes an input terminal 110A, output terminals 110B and 110C, an inverter 111, and an inverter 112. The input terminal 110A is an example of a first input unit and the output terminals 110B and 110C are an example of a pair of first output units.

A high power-supply voltage VDD (High) and a substrate voltage VB of a reverse bias (Reverse) are supplied to the input stage 110, and the input stage 110 is driven by the high power-supply voltage VDD (High) and the substrate voltage VB of a reverse bias (Reverse).

The input terminal 110A is an input terminal of the data holding circuit 100 and data (DATA) is input into the input terminal 110A from the combination circuit 32 (FIG. 9). To the input terminal 110A, an input terminal of the inverter 111 is connected.

In this description, the inverter 111 is a constituent element of the input stage 110. However, the inverter 111 may not be a constituent element of the input stage 110.

The input terminal of the inverter 111 is connected with the input terminal 110A. An output terminal of the inverter 111 is connected with the output terminal 110B via the inverter 112 and connected with the output terminal 110C.

The inverter 112 is inserted between the output terminal of the inverter 111 and the output terminal 110B.

The input stage 110 generates data D and DB in a differential form from data input into the input terminal 110A and outputs the data D and DB from the output terminals 110B and 110C. The data DB is data obtained by inverting the data D.

The gate unit 120 includes NMOS transistors 121 and 122. The NMOS transistors 121 and 122 of the gate unit 120 are an example of a pair of first gate elements.

A drain of the NMOS transistor 121 is connected with the output terminal 110B of the input stage 110 and a source is connected with an input terminal 130A of the master latch 130. Into a gate of the NMOS transistor 121, a clock CLKB is input from the clock generation unit 160.

A drain of the NMOS transistor 122 is connected with the output terminal 110C of the input stage 110 and a source is connected with an input terminal 130B of the master latch 130. Into a gate of the NMOS transistor 122, a clock CLKB is input from the clock generation unit 160.

The master latch 130 includes the input terminals 130A and 130B, output terminals 130C and 130D, and inverters 131 and 132. The master latch 130 is an example of a first latch circuit.

A high power-supply voltage VDD (High) and a substrate voltage VB of a reverse bias (Reverse) are supplied to the master latch 130, and the master latch 130 is driven by the high power-supply voltage VDD (High) and the substrate voltage VB of a reverse bias (Reverse).

Input terminals and output terminals of the inverter 131 and the inverter 132 are mutually connected in a cross-coupled manner so as to constitute a cross-coupled feedback circuit. That is, the input terminal of the inverter 131 is connected with the output terminal of the inverter 132 and the input terminal of the inverter 132 is connected with the output terminal of the inverter 131.

Further, the input terminal of the inverter 131 is connected with the input terminal 130A and the output terminal of the inverter 131 is connected with the output terminal 130C. The input terminal of the inverter 132 is connected with the input terminal 130B and the output terminal of the inverter 132 is connected with the output terminal 130D.

The master latch 130 outputs data M and data MB which are obtained by respectively inverting the data D and the data DB which are received from the input stage 110 via the gate unit 120.

The gate unit 140 includes NMOS transistors 141 and 142. The NMOS transistors 141 and 142 of the gate unit 140 are an example of a pair of second gate elements.

A drain of the NMOS transistor 141 is connected with the output terminal 130C of the master latch 130 and a source is connected with an input terminal 150A of the slave latch 150.

Into a gate of the NMOS transistor 141, a clock CLK is input from the clock generation unit 160.

A drain of the NMOS transistor 142 is connected with the output terminal 130D of the master latch 130 and a source is connected with an input terminal 150B of the slave latch 150. Into a gate of the NMOS transistor 142, a clock CLK is input from the clock generation unit 160.

The slave latch 150 includes the input terminals 150A and 150B, an output terminal 150C, and inverters 151, 152, and 153. The slave latch 150 is an example of a second latch circuit. The input terminals 150A and 150B are an example of a pair of third input units and the output terminal 150C is an example of a third output unit.

A high power-supply voltage VDD (High) and a substrate voltage VB of a reverse bias (Reverse) are supplied to the slave latch 150, and the slave latch 150 is driven by the high power-supply voltage VDD (High) and the substrate voltage VB of a reverse bias (Reverse).

Input terminals and output terminals of the inverter 151 and the inverter 152 are mutually connected in a cross-coupled manner so as to constitute a cross-coupled feedback circuit. That is, the input terminal of the inverter 151 is connected with the output terminal of the inverter 152 and the input terminal of the inverter 152 is connected with the output terminal of the inverter 151.

The input terminal of the inverter 151 is connected with the input terminal 150A and the output terminal of the inverter 151 is connected with the input terminal of the inverter 152. The input terminal of the inverter 152 is connected with the input terminal 150B and the output terminal of the inverter 152 is connected with the output terminal 150C via the inverter 153.

The inverter 153 is inserted between the output terminal of the inverter 152 and the output terminal 150C. An input terminal of the inverter 153 is connected with the input terminal 150A and the output terminal of the inverter 152.

The inverters 151 and 152 output two pieces of data S and SB which are obtained by respectively inverting the data M and the data MB which are received from the master latch 150 via the gate unit 140.

The slave latch 150 inputs one (data SB) of the two pieces of data S and SB into the inverter 153 and outputs output data OUT which is obtained by inverting the data SB.

The output data OUT is data to which input data DATA is reflected and has a signal level equivalent to that of the input data DATA.

In this description, the inverter 153 is a constituent element of the slave latch 150. However, the inverter 153 may be an output stage which is connected on an output side of the slave latch 150, instead of the constituent element of the slave latch 150.

The clock generation unit 160 includes a clock input terminal 160A, clock output terminals 160B and 160C, and an inverter 161.

A low power-supply voltage VDD (Low) and a substrate voltage VB of a forward bias (Forward) are supplied to the clock generation unit 160, and the clock generation unit 160 is driven by the low power-supply voltage VDD (Low) and the substrate voltage VB of a forward bias (Forward).

The clock input terminal 160A is connected with the circuit 20 and receives a clock CLK from the circuit 20. Further, to the clock input terminal 160A, the clock output terminal 160B is connected, and the clock output terminal 160C is connected via the inverter 161.

The clock output terminal 160B directly outputs the clock CLK which is input into the clock input terminal 160A.

The clock output terminal 160C outputs a clock CLKB which is obtained by inverting the clock CLK, which is input into the clock input terminal 160A, by the inverter 161.

The inverter 161 is inserted between the clock input terminal 160A and the clock output terminal 160C and outputs a clock CLKB which is obtained by inverting a clock CLK which is input into the clock input terminal 160A.

Signal levels of the H level of the clocks CLK and CLKB which are output by the clock generation unit 160 are a low power-supply voltage VDD (Low) and signal levels of the L level are a VSS (ground voltage). Signal levels of the H level of the clocks CLK and CLKB are on the L level. Thus, the clocks CLK and CLKB are an example of a clock including a second power-supply voltage which is lower than the first power-supply voltage.

Accordingly, in the data holding circuit 100 illustrated in FIG. 10, a signal level of the H level of the clock CLKB which is input into the gates of the NMOS transistors 121 and 122 of the gate unit 120 from the clock generation unit 160 is a low power-supply voltage VDD (Low) and a signal level of the L level is a VSS (ground voltage).

Further, a signal level of the H level of the clock CLK which is input into the gates of the NMOS transistors 141 and 142 of the gate unit 140 from the clock generation unit 160 is a low power-supply voltage VDD (Low) and a signal level of the L level is a VSS (ground voltage).

An operation of the data holding circuit 100 is now described with reference to FIG. 11.

Figure 11:
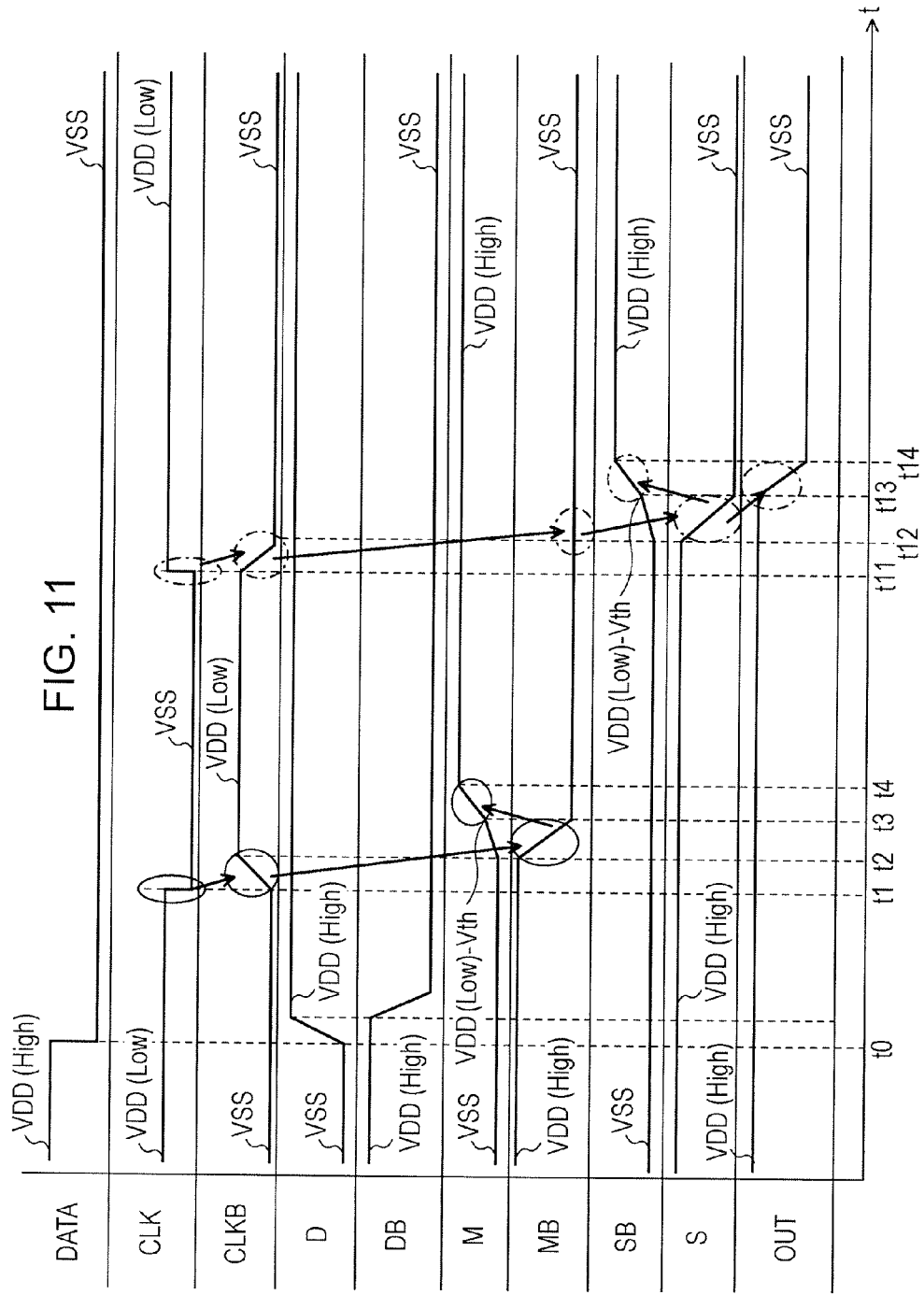
FIG. 11 is a timing chart illustrating an operation of the data holding circuit.

FIG. 11 is a timing chart illustrating an operation of the data holding circuit 100.

FIG. 11 illustrates input data DATA which is input into the input terminal 110A of the input stage 110, clocks CLK and CLKB which are output by the clock generation unit 160, and data D and DB which are output from the input stage 110.

FIG. 11 further illustrates data M and MB which are output by the master latch 130, data S and SB which are output by the inverters 151 and 152 of the slave latch 150, and output data OUT which is output from the output terminal 150C of the slave latch 150.

Here, the H level of the input data DATA, the data D and DB, the data M and MB, the data S and SB, and the output data OUT is a high power-supply voltage VDD (High) and the L level is a VSS (ground voltage).

The H level of the clocks CLK and CLKB is a low power-supply voltage VDD (Low) and the L level is a VSS (ground voltage).

First, the input data DATA falls from the H level to the L level at time t0. Accordingly, the data D rises from the L level to the H level and then, the data DB falls from the H level to the L level.

When the clock CLK falls from the H level to the L level at time t1, the clock CLKB rises at time t2. Accordingly, the NMOS transistors 121 and 122 of the gate unit 120 are turned on, so that the L level of the data DB is reflected to the data MB at time t3 via the NMOS transistor 121. Then, the data M rises to the H level which is obtained by inverting the L level of the data MB, at time t4 which follows time t3.

Here, the data MB first changes between the data M and the data MB because the data D and the data DB are respectively on the H level and the L level and the NMOS transistors 121 and 122 correctly transmit a signal of the L level.

Further, when the clock CLK rises to the H level at time t11, the clock CLKB falls to the L level at time t12. Accordingly, the NMOS transistors 141 and 142 of the gate unit 140 are turned on, so that the L level of the data MB is reflected to the data S at time t13 via the NMOS transistor 142. Then, the data SB rises to the H level which is obtained by inverting the L level of the data S, at time t14 which follows time t13.

Accordingly, the output data OUT falls to the L level at time t14.

Through the above-described operation, the data holding circuit 100 holds input data.

Thus, according to the data holding circuit 100, the inverters 111 and 112 which are included in the input stage 110, the inverters 131 and 132 which are included in the master latch 130, and the inverters 151, 152, and 153 which are included in the slave latch 150 are driven by a high power-supply voltage VDD (High) and a substrate voltage VB of a reverse bias (Reverse).

Then, data D and DB in a differential form are generated from the input data DATA and the NMOS transistors 121 and 122 of the gate unit 120 alternately acquire data of the L level through two data paths.

In a similar manner, the NMOS transistors 141 and 142 of the gate unit 140 alternately acquire data of the L level through two data paths.

Data which passes through the NMOS transistors 121, 122, 141, and 142 by two data paths is data of the L level and data of the L level appears on the two data paths alternately.

Then, the slave latch 150 generates the H level (H level based on a VDD (High)) on the basis of the data of the L level.

Therefore, the level shifters 40 (refer to FIG. 5), 40A (refer to FIG. 6), and 80 (refer to FIG. 7) of the technical premise do not have to be used. Accordingly, it is possible to reduce an area for implementation of a circuit and realize power saving.

Thus, the data holding circuit 100 is capable of realizing reduction of overhead.

Further, no level shifter is included, so that delay which is generated in the level shifters 40 (refer to FIG. 5), 40A (refer to FIG. 6), and 80 (refer to FIG. 7) of the technical premise does not occur.

Accordingly, it is possible to reduce a PD product and therefore, realize power saving.

Further, according to the data holding circuit 100, a substrate voltage of a reverse bias (Reverse) is applied to the inverters 111 and 112 which are included in the input stage 110, the inverters 131 and 132 which are included in the master latch 130, and the inverters 151, 152, and 153 which are included in the slave latch 150.

Accordingly, leak current of the inverters 111, 112, 131, 132, 151, 152, and 153 is reduced, making it possible to realize reduction of power consumption.

Further, according to the data holding circuit 100, the NMOS transistors 121, 122, 141, and 142 are used in the gate units 120 and 140 and data of the L level is transmitted by the gate units 120 and 140.

Therefore, even if a signal level of the H level of clocks CLK and CLKB which are input into the gates of the NMOS transistors 121, 122, 141, and 142 is a low power-supply voltage VDD (Low), unlike the TG 92 (refer to FIG. 8) of the technical premise, a problem of difficulty in holding data does not arise.

Accordingly, it is possible to provide the data holding circuit 100 with high reliability.

Here, in the above description, the gate units 120 and 140 respectively include the NMOS transistors 121 and 122 and the NMOS transistors 141 and 142 and transmit data of the L level.

However, the gate units 120 and 140 may include PMOS transistors instead of the NMOS transistors 121, 122, 141, and 142. A PMOS transistor is capable of precisely transmitting a signal of the H level. Therefore, when the gate units 120 and 140 include PMOS transistors, it is sufficient for the gate units 120 and 140 to transmit data of the H level.

Figure 12:
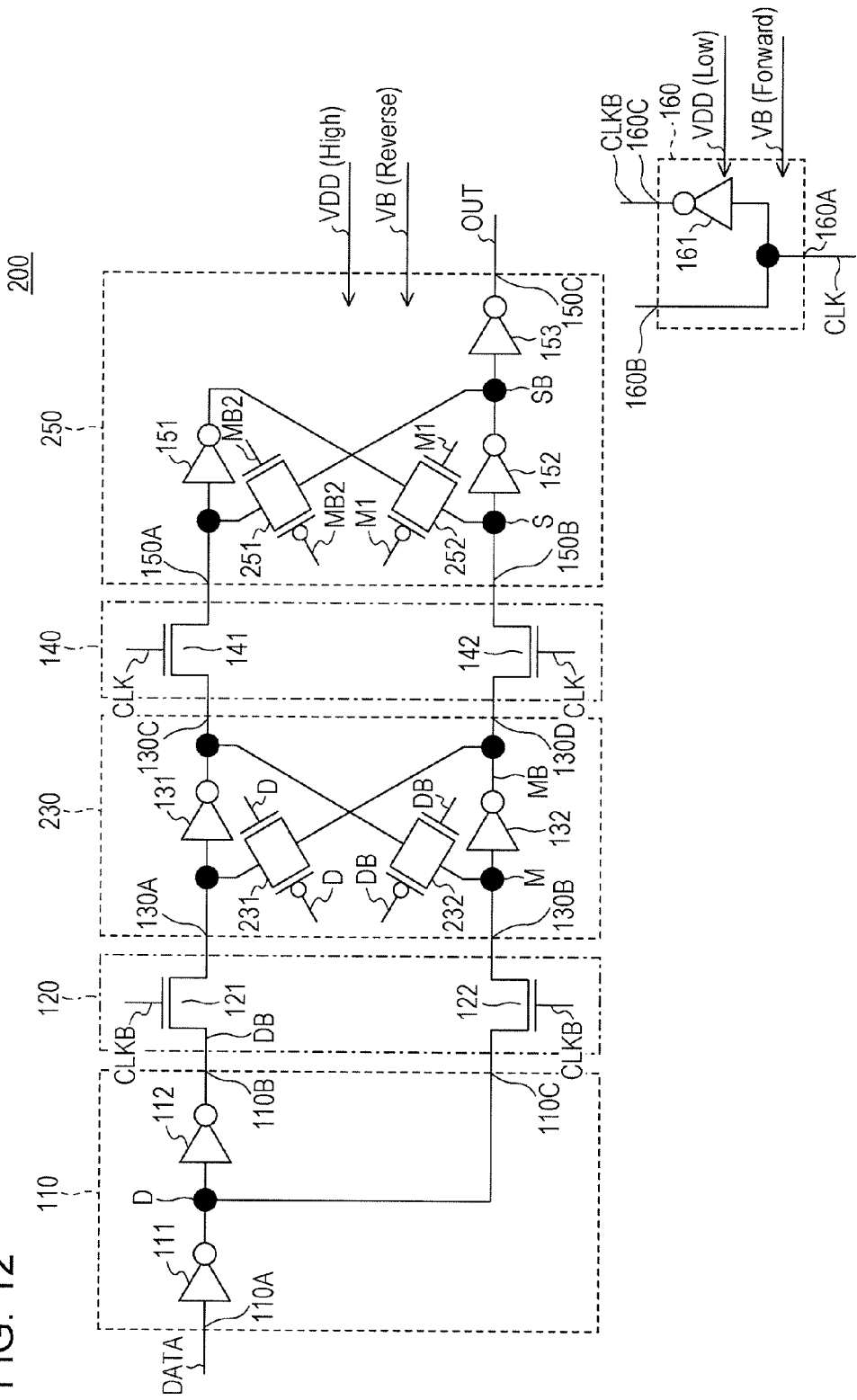
FIG. 12 illustrates a data holding circuit.

FIG. 12 illustrates a data holding circuit 200.

The data holding circuit 200 includes an input stage 110, a gate unit 120, a master latch 230, a gate unit 140, and a slave latch 250.

The data holding circuit 200 is obtained by respectively replacing the master latch 130 and the slave latch 150 of the data holding circuit 100 with the master latch 230 and the slave latch 250.

Other configurations of the data holding circuit 200 are the same as those of the data holding circuit 100, so that the same constituent elements are given the same reference characters and description thereof is omitted.

The master latch 230 includes stabilizing circuits 231 and 232 in addition to input terminals 130A and 130B, output terminals 130C and 130D, and inverters 131 and 132. The inverters 131 and 132 are respectively examples of a first inverter and a second inverter.

The stabilizing circuit 231 is inserted between the input terminal 130A and the output terminal 130D and includes an NMOS transistor and a PMOS transistor of which main paths (between a drain and a source) are mutually connected in parallel. The stabilizing circuit 231 is an example of a first stabilizing circuit.

In other words, the stabilizing circuit 231 is inserted between an input terminal of the inverter 131 and an output terminal of the inverter 132. Into gates of the NMOS transistor and the PMOS transistor of the stabilizing circuit 231, data D is input from the input stage 110.

The stabilizing circuit 232 is inserted between the input terminal 130B and the output terminal 130C and includes an NMOS transistor and a PMOS transistor of which main paths (between a drain and a source) are mutually connected in parallel. The stabilizing circuit 232 is an example of a second stabilizing circuit.

In other words, the stabilizing circuit 232 is inserted between an input terminal of the inverter 132 and an output terminal of the inverter 131. Into gates of the NMOS transistor and the PMOS transistor of the stabilizing circuit 232, data DB is input from the input stage 110.

Here, the input terminal of the inverter 131, the output terminal of the inverter 131, the input terminal of the inverter 132, and the output terminal of the inverter 132 of the master latch 230 are respectively denoted as a node MB1, a node M1, a node M2, and a node MB2.

The slave latch 250 includes stabilizing circuits 251 and 252 in addition to input terminals 150A and 150B, an output terminal 150C, and inverters 151, 152, and 153. The inverters 151 and 152 are respectively examples of a third inverter and a fourth inverter.

The stabilizing circuit 251 is inserted between an input terminal of the inverter 151 and an output terminal of the inverter 152 and includes an NMOS transistor and a PMOS transistor of which main paths (between a drain and a source) are mutually connected in parallel. The stabilizing circuit 251 is an example of a third stabilizing circuit.

Into gates of the NMOS transistor and the PMOS transistor of the stabilizing circuit 251, data (potential) of the node MB2 of the master latch 230 is input.

The stabilizing circuit 252 is inserted between an input terminal of the inverter 152 and an output terminal of the inverter 151 and includes an NMOS transistor and a PMOS transistor of which main paths (between a drain and a source) are mutually connected in parallel. The stabilizing circuit 252 is an example of a fourth stabilizing circuit.

Into gates of the NMOS transistor and the PMOS transistor of the stabilizing circuit 252, data (potential) of the node M1 of the master latch 230 is input.

Here, the input terminal of the inverter 151, the output terminal of the inverter 151, the input terminal of the inverter 152, and the output terminal of the inverter 152 of the slave latch 250 are respectively denoted as a node SB3, a node S3, a node S4, and a node SB4.

Subsequently, an operation of the data holding circuit 200 is described with reference to FIG. 13.

Figure 13:
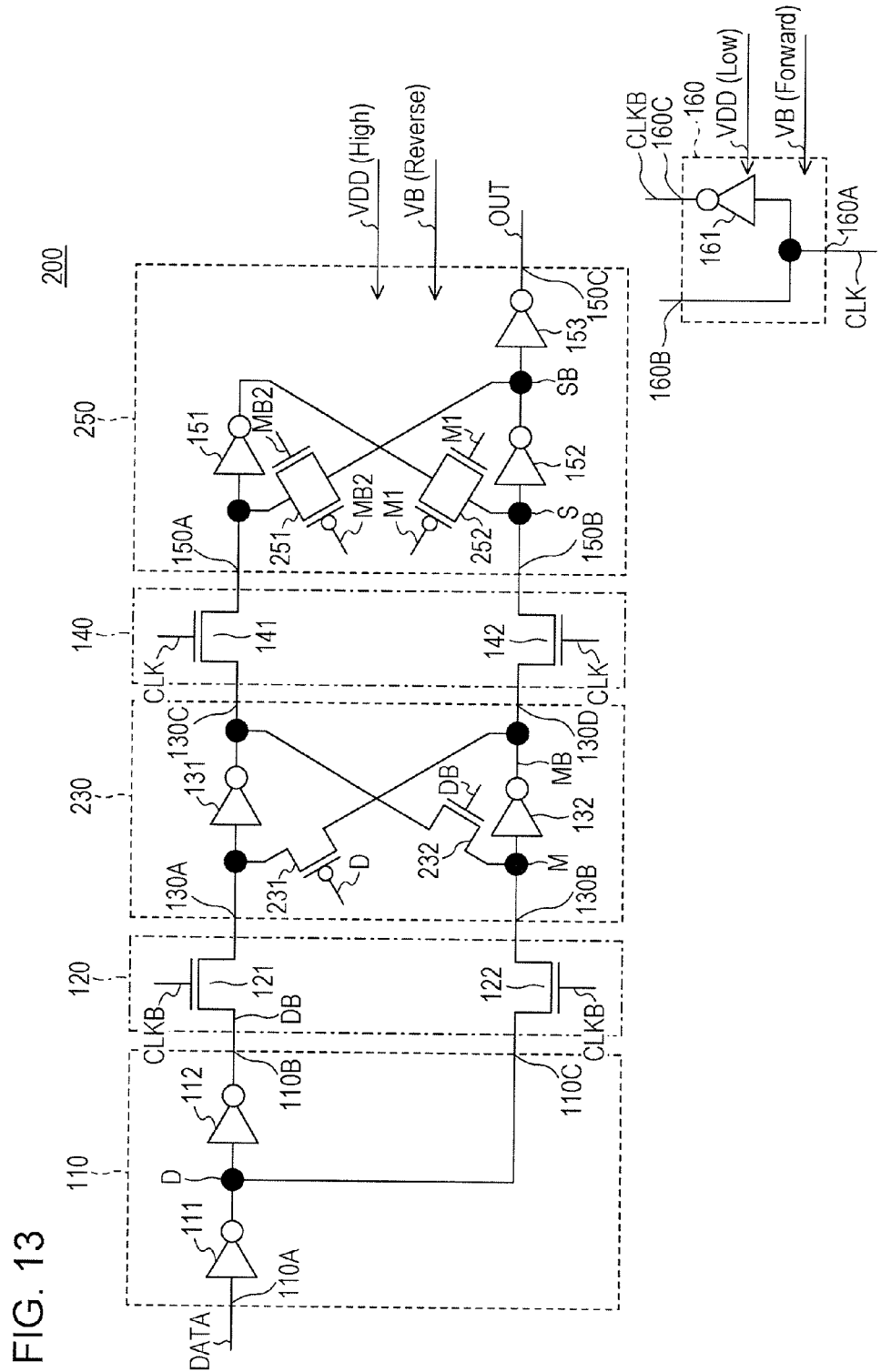
FIG. 13 illustrates one of operation states of the data holding circuit.

FIG. 13 illustrates one of operation states of the data holding circuit 200.

FIG. 13 illustrates a state in which the PMOS transistor of the stabilizing circuit 231 and the NMOS transistor of the stabilizing circuit 232 are on, as an example, to describe operations of the stabilizing circuits 231 and 232.

Therefore, the PMOS transistor of the stabilizing circuit 231 and the NMOS transistor of the stabilizing circuit 232 are illustrated, but the NMOS transistor of the stabilizing circuit 231 and the PMOS transistor of the stabilizing circuit 232 are omitted in FIG. 13.

When data D is on the L level in the inside of the input stage 110, the NMOS transistor of the stabilizing circuit 232 is turned on between the nodes M1 and M2 of the master latch 230. Therefore, it is hard for a signal on the H level to travel from the node M1 to the node M2.

Accordingly, even if the node M1 is on the H level, writing from the H level to the L level is easily performed at the node M2 in a stable manner.

At this time, the PMOS transistor of the stabilizing circuit 231 is on. Therefore, when the node MB2 is on the H level, it is not hard to perform writing of the H level from the node MB2 to the node MB1.

On the other hand, when data D is on the H level in the inside of the input stage 110, the NMOS transistor of the stabilizing circuit 231 is turned on between the nodes MB2 and MB1 of the master latch 230. Therefore, it is hard for a signal on the H level to travel from the node MB2 to the node MB1.

Accordingly, even if the node MB2 is on the H level, writing from the H level to the L level is easily performed at the node MB1 in a stable manner.

At this time, the PMOS transistor of the stabilizing circuit 232 is on. Therefore, when the node M1 is on the H level, it is not hard to perform writing of the H level from the node M1 to the node M2.

As described above, it is possible to realize stabilization of an operation of the master latch 230 which includes the stabilizing circuits 231 and 232.

Further, this operation is similar to that of the slave latch 250 which has the similar circuit configuration.

When the node M1 is on the H level, the NMOS transistor of the stabilizing circuit 252 is turned on between the nodes S3 and S4 of the slave latch 250. Therefore, it is hard for a signal on the H level to travel from the node S3 to the node S4.

Accordingly, even if the node S3 is on the H level, writing from the H level to the L level is easily performed at the node S4 in a stable manner.

At this time, the PMOS transistor of the stabilizing circuit 251 is on. Therefore, when the node SB4 is on the H level, it is not hard to perform writing of the H level from the node SB4 to the node SB3.

On the other hand, when the node M1 is on the L level, the NMOS transistor of the stabilizing circuit 251 is turned on between the nodes SB4 and SB3 of the slave latch 250. Therefore, it is hard for a signal on the H level to travel from the node SB4 to the node SB3.

Accordingly, even if the node SB4 is on the H level, writing from the H level to the L level is easily performed at the node SB3 in a stable manner.

At this time, the PMOS transistor of the stabilizing circuit 252 is on. Therefore, when the node S3 is on the H level, it is not hard to perform writing of the H level from the node S3 to the node S4.

As described above, it is possible to realize stabilization of an operation of the slave latch 250 which includes the stabilizing circuits 251 and 252.

As described above, according to the embodiment, it is possible to provide the data holding circuit 200 in which reliability is enhanced by reduction of overhead, reduction of power consumption, and stable retention of data and of which an operation is further stabilized by the stabilizing circuits 231, 232, 251, and 252.

The data holding circuit and the semiconductor integrated circuit device according to the embodiment of the present disclosure have been described thus far. However, embodiments of the present disclosure are not limited to the embodiment which is specifically disclosed and various modifications and alterations may be made within the scope of the present disclosure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A data holding circuit, comprising:
an input stage that includes a first input unit into which input data is input and a pair of first output units that outputs differential data based on the input data, and is driven by a first power-supply voltage;
a pair of first gate elements that includes first transistors, the first transistors being correspondingly connected with the pair of first output units of the input stage and being driven by an inverted clock of an input clock from a clock generation unit that is driven by a second power-supply voltage which is lower than the first power-supply voltage and is greater than a ground voltage;
a first latch circuit that includes a pair of second input units, the pair of second input units being correspondingly connected with the pair of first gate elements, and a pair of second output units that outputs pieces of data, the pieces of data being correspondingly obtained by inverting pieces of data that are input into the pair of second input units, and is driven by the first power-supply voltage;
a pair of second gate elements that includes second transistors, the second transistors being correspondingly connected with the pair of second output units of the first latch circuit and having a polarity identical to a polarity of the first transistors and being driven by the input clock; and
a second latch circuit that includes a pair of third input units, the pair of third input units being correspondingly connected with the pair of second gate elements, and a third output unit that outputs one of a pair of pieces of data, the pair of pieces of data being obtained by correspondingly inverting pieces of data that are input into the pair of third input units, and is driven by the first power-supply voltage, wherein the input stage, the first latch circuit, and the second latch circuit are driven by the first power-supply voltage and a substrate voltage of a reverse bias so as to decrease a power delay product.

2. The data holding circuit according to claim 1, wherein the pair of first gate elements is a pair of N-channel metal oxide semiconductor (NMOS) transistors and is turned on by the inverted clock of which a H level is the second power-supply voltage, and the pair of second gate elements is a pair of NMOS transistors and is turned on by the input clock of which the H level is the second power-supply voltage.

3. The data holding circuit according to claim 1, wherein the first latch circuit includes:

a first inverter and a second inverter of which input terminals and output terminals are mutually connected in a cross-coupled manner, a first stabilizing circuit that includes a pair of transistors of which a main path is, connected between the output terminal of the first inverter and the input terminal of the second inverter and that includes a control terminal into which an inverted signal of the data is input and has polarities that are different from each other, and a second stabilizing circuit that includes a pair of transistors of which a main path is connected between the output terminal of the second inverter and the input terminal of the first inverter and that includes a control terminal into which a non-inverted signal of the data is input and has polarities that are different from each other.

4. The data holding circuit according to claim 1, wherein the second latch circuit includes:

a third inverter and a fourth inverter of which input terminals and output terminals are mutually connected in a cross-coupled manner, a third stabilizing circuit that includes a pair of transistors of which a main path is connected between the output terminal of the third inverter and the input terminal of the fourth inverter and that includes a control terminal into which an inverted signal of the data is input and has polarities that are different from each other, and a fourth stabilizing circuit that includes a pair of transistors of which a main path is connected between the output terminal of the fourth inverter and the input terminal of the third inverter and that includes a control terminal into which a non-inverted signal of the data is input and has polarities that are different from each other.

5. The data holding circuit according to claim 1, wherein the second latch circuit further includes an inverter that inverts one of a pair of pieces of data, the pair of pieces of data being obtained by correspondingly inverting pieces of data that are input into the pair of third input units, before outputting the one of the pair of pieces of data from the third output unit.

6. The data holding circuit according to claim 1, further comprising:

a clock generation unit configured to provide the input clock and the inverted clock on the basis of a reference clock.

7. A semiconductor integrated circuit device, comprising:

a data holding circuit including:

an input stage that includes a first input unit into which input data is input and a pair of first output units that outputs differential data based on the input data, and is driven by a first power-supply voltage, a pair of first gate elements that includes first transistors, the first transistors being correspondingly connected with the pair of first output units of the input stage and being driven by an inverted clock of an input clock from a clock generation unit that is driven by a second power-supply voltage which is lower than the first power-supply voltage and is greater than a ground voltage, a first latch circuit that includes a pair of second input units, the pair of second input units being correspondingly connected with the pair of first gate elements, and a pair of second output units that outputs pieces of data, the pieces of data being correspondingly obtained by inverting pieces of data that are input into the pair of second input units, and is driven by the first power-supply voltage, a pair of second gate elements that includes second transistors, the second transistors being correspondingly connected with the pair of second output units of the first latch circuit and having a polarity identical to a polarity of the first transistors and being driven by the input clock, and a second latch circuit that includes a pair of third input units, the pair of third input units being correspondingly connected with the pair of second gate elements, and a third output unit that outputs one of a pair of pieces of data, the pair of pieces of data being obtained by correspondingly inverting pieces of data that are input into the pair of third input units, and is driven by the first power-supply voltage;

a clock transmission circuit that is driven by the second power-supply voltage and a substrate voltage of a forward bias and transmits a clock that is output from the clock generation unit; and a combination circuit that is driven by the first power-supply voltage and the substrate voltage of a reverse bias and is configured to provide the data to the data holding circuit, wherein the input stage, the first latch circuit, and the second latch circuit are driven by the first power-supply voltage and the substrate voltage of the reverse bias so as to decrease a power delay product.

8. The semiconductor integrated circuit device according to claim 7, wherein the first input unit of the data holding circuit is connected to an output terminal of the combination circuit and the third output unit of the data holding circuit is connected to an input terminal of the combination circuit.

* * * * *